United States Patent [19]

Nakao

[11] Patent Number: 5,552,727

[45] Date of Patent: Sep. 3, 1996

[54] DIGITAL PHASE LOCKED LOOP CIRCUIT

[75] Inventor: Yuichi Nakao, Itami, Japan

[73] Assignee: Mitsubishi Denki Kabushiki Kaisha, Tokyo, Japan

[21] Appl. No.: 316,463

[22] Filed: Sep. 30, 1994

[30] Foreign Application Priority Data

Oct. 6, 1993 [JP] Japan .................................. 5-250429

[51] Int. Cl.$^6$ ............................ H03K 5/159; H03L 7/189
[52] U.S. Cl. ......................... 327/159; 327/105; 327/261; 327/277; 327/156; 327/158; 327/147; 327/149; 331/DIG. 2; 331/17
[58] Field of Search ..................................... 327/106, 105, 327/107, 159, 158, 258, 153, 156, 261, 270, 265, 277, 147, 150, 149; 331/16, 17, 1 A, DIG. 2

[56] References Cited

U.S. PATENT DOCUMENTS

| | | | |
|---|---|---|---|
| 4,943,786 | 7/1990 | Cordwell et al. | 331/17 |
| 5,028,885 | 7/1991 | Voigt et al. | 331/14 A |
| 5,216,302 | 6/1993 | Tanizawa | 327/272 |
| 5,254,958 | 10/1993 | Flach et al. | 331/16 |
| 5,389,830 | 2/1995 | Brickingham et al. | 327/258 |
| 5,408,196 | 4/1995 | Sempel et al. | 331/16 |

OTHER PUBLICATIONS

"Phase lock loop with delay line oscillator", Laurich et al., IBM Technical Disclosure Bulletin, vol. 13, No. 7 Dec. 1970, pp. 1863–1864.

"Design of PLL–Based Clock Generation Circuits", Deog–Kyoon Jeong et al., IEEE Journal of Solid–State Circuits, vol. SC–22, No. 2, Apr. 1987.

"A Variable Delay Line PLL for CPU–Coprocessor Synchronization", Mark Johnson et al., IEEE Journal of Solid–State Circuits, vol. 23, No. 5, Oct. 1988.

*Primary Examiner*—Timothy P. Callahan
*Assistant Examiner*—Dinh T. Le
*Attorney, Agent, or Firm*—Lowe, Price, LeBlanc & Becker

[57] ABSTRACT

A digital circuit apparatus having an A/D converter for digitizing a control voltage which determines the oscillation frequency of an internal clock outputted from a voltage-controlled oscillator, a storing unit for holding a digitalized value, a D/A converter with corrective function for correcting the digital value being held and subjecting the corrected digital value to D/A conversion, and a lock detector for detecting the matching in phase of the internal clock and an external clock. Phase information obtained when the internal clock and the external clock match in phase is held so that, when the generation of the internal clock outputted from the voltage-controlled oscillator is halted and then resumed, the matching in phase of the external clock and internal clock can be achieved in a short period of time.

6 Claims, 12 Drawing Sheets

DIGITAL PHASE LOCKED LOOP CIRCUIT

BACKGROUND OF THE INVENTION

1. Field of the Invention

The present invention relates to a digital circuit apparatus having the function of adjusting the phase of an internal clock generated by a voltage-controlled oscillator and the phase of an external clock inputted from the outside. More particularly, it relates to a digital circuit apparatus which can reduce the time required to resume the generation of the internal clock that has temporarily been halted.

2. Description of Related Art

By way of example, FIGS. 1 and 2 show the configuration of a digital circuit apparatus having the function of adjusting the phase of an internal clock generated by a voltage-controlled oscillator (hereinafter referred to as VCO circuit) and the phase of an external clock supplied from the outside.

FIG. 1 is a block diagram showing the configuration of a PLL (Phase Locked Loop) composed of the VCO circuit, wherein the external clock supplied from the outside is inputted to one input terminal of a phase comparator 3, and a phase comparison result signal 4 outputted from the phase comparator 3 is inputted to a low-pass filter 5. A VCO-circuit voltage control signal (herein after referred to as VCO voltage control signal) 6 outputted from the low-pass filter 5 is inputted to the VCO circuit 17. The VCO circuit 17 outputs an internal clock 18, which is inputted to a frequency divider 19. A divided frequency clock 2 outputted from the frequency divider 19 is inputted to the other input terminal of the phase comparator 3.

Next, a description will be given to the operation of the digital circuit apparatus. Upon energizing the digital circuit apparatus, the VCO circuit 17 initiates an oscillating operation. The oscillation frequency of the VCO 17 varies as the value of the VCO voltage control signal 6 varies. Here, the digital circuit apparatus is constituted so that the oscillation frequency of the VCO circuit 17 increases as the voltage of the VCO voltage control signal 6 increases. The frequency divider 19 divides the frequency of the internal clock 18 outputted from the VCO circuit 17 at a specified ratio and outputs the divided frequency clock 2. The phase comparator 3 outputs a phase comparison result signal 4 indicating the lead of the divided frequency clock 2 in phase, during the period in which the divided frequency clock 2 is ahead of the external clock 1 in phase. On the other hand, the phase comparator 3 outputs a phase comparison result signal 4 indicating the delay of the divided frequency clock 2 in phase, during the period in which the divided frequency clock 2 is behind the external clock 1 in phase.

When the phase comparison result signal 4 is inputted to the low-pass filter 5, the low-pass filter 5 lowers the VCO voltage control signal 6 during the period in which the phase comparison result signal 4 indicating the lead of the divided frequency clock 2 in phase is inputted, while it raises the VCO voltage control signal 6 during the period in which the phase comparison result signal 4 indicating the delay of the divided frequency clock 2 in phase is inputted. Thus, when the divided frequency clock 2 is behind the external clock 1, the low-pass filter 5 raises the VCO voltage control signal 6 so that the oscillation frequency of the VCO circuit 17 increases, thereby causing the divided frequency clock 2 to be ahead of the external clock 1 in phase. Conversely, when the divided frequency 2 is ahead of the external clock 1, the divided frequency clock 2 is caused to lessen the degree of its lead in phase.

After the time required to match the phases elapsed, the phase and frequency of the divided frequency clock 2 eventually become the same as those of the external clock 1, while the frequency of the internal clock 18 becomes an integral multiple of the frequency of the external clock 1, thereby establishing a predetermined phase relationship. Therefore, the digital circuit apparatus is effective in the case of using the external clock 1 as the internal clock 18 after integrally multiplying its frequency or in the case of requiring the internal clock 18 having substantially no phase difference between the external clock 1 and itself, which is obtained by compensating for the delay of a clock buffer.

Specific examples of the phase comparator 3, the low-pass filter 5, and the VCO circuit 17 are well known. Well-known examples of the phase comparator 3 are shown in: FIG. 3(a) of "Design of PLL-Based Clock Generation Circuits" (IEEE Journal of Solid-State Circuits, Vol.22 No.2, Apr. 1987, pp.255–261) [Document I]; and FIG. 7 of "A Variable Delay Line PLL for CPU-Coprocessor Synchronization" (IEEE Journal of Solid-State Circuits, Vol.23, No.5, Oct. 1988, pp.1218–1223) [Document II]. Well-known examples of the low-pass filter circuit 5 are shown in: FIG. 3(b) of [Document I] mentioned above; and FIG. 8 of [Document II] mentioned above. Well-known examples of the VCO circuit 17 are shown in FIGS. 4(a) and 3(c) of [Document I].

FIG. 2 is a block diagram of a digital circuit apparatus in which the phases of two clocks are synchronized by means of a Voltage Control Delay Line (hereinafter referred to as VCDL) circuit. The external clock 1 is inputted to a first circuit block 23 and a first internal clock 24 is outputted from the first circuit block 23. The first internal clock 24 is inputted to one input terminal of the phase comparator 3 in a second circuit block 25. The external clock 1 is inputted to a VCDL circuit 60 in the second circuit block 25, while a second internal clock 26 is outputted from the VCDL circuit 60. The second internal clock 26 is inputted to the other input terminal of the phase comparator 3. The phase comparison result signal outputted from the phase comparator 3 is inputted to the low-pass filter 5, while a VCDL voltage control signal 61 is supplied to the VCDL circuit 60.

Next, a description will be given to the operation of the digital circuit apparatus. The internal clocks are generated from the external clock 1 in the circuit blocks 23 and 25. When the delay of the internal clock 24 in the first circuit block 23 is significant, the phase difference between the internal clocks 24 and 26 is diminished by delaying the internal clock 26 in the second circuit block 25. As for the portion for generating the VCDL voltage control signal 61 by means of the phase comparator 3 and the low-pass filter 5, it is similar to the portion shown in FIG. 1, and the VCDL voltage control signal 61 outputted from the low-pass filter circuit 5 is inputted to the VCDL circuit 60. Since the external clock 1 has been inputted to the VCDL circuit 60, the phase difference between the external clock 1 and the internal clock 26 outputted from the second circuit block 25 is adjusted in accordance with the voltage value of the VCDL voltage control signal 61.

When the internal clock 26 outputted from the second circuit block 25 is delayed, the phase difference between the internal clock 26 and the internal clock 24 outputted from the first circuit block 23 is reduced. Consequently, it becomes easier for the second circuit block 25 to sample a signal generated in the first circuit block 23 in synchronization with the internal clock 24.

Examples of the VCDL circuit 60 are shown in FIGS. 5 and 3(b) of [Document II] mentioned above. The VCDL circuit and the VCO circuit can be implemented by similar circuit configurations, except that the input signal to the VCDL circuit is delayed only through a voltage control delay system before it is outputted, while the VCO circuit is constituted so that the output signal from the voltage control delay system is inverted before it is fed back to the input of the VCO circuit.

In the above-mentioned digital circuit apparatus, when the supply of the internal clock is temporarily halted for the purpose of lowering power consumption during the period in which the circuit operation is not needed, the analog output voltage of the low-pass filter constituting the PLL varies during the period in which the internal clock is halted. In the case of resuming the supply of the internal clock afterward, it is necessary to adjust the phases of the clocks again from the beginning. Consequently, in resuming the generation of the internal clock that has temporarily been halted, there is required a period of time for adjusting the phases ranging from several tens of clock cycles to several thousands of clock cycles, similarly to the phase adjustment in initiating the energization of the digital circuit apparatus. Since the external clock and internal clock do not match in phase in the mean time, transmission of a signal can not be resumed between the digital circuit apparatus and the outside.

SUMMARY OF THE INVENTION

A principal object of the present invention is to provide a digital circuit apparatus wherein the generation of the internal clock, which has temporarily been halted, can be resumed promptly.

A digital circuit apparatus according to a first invention has: an analog-to-digital converter for subjecting an analog voltage outputted from a control voltage generator to analog-to-digital conversion in relation to the phases of an internal clock and external clock; latch circuit for storing a digital signal obtained through the A/D conversion; a digital-to-analog converter with corrective function to which a signal read out of the storage unit is to be inputted; and a lock detector for detecting the matching in phase of the clock outputted from the controlled-voltage oscillator and external clock. According to the first invention, the analog voltage generated in relation to the phase difference between the internal clock and the external clock is subjected to the A/D conversion and the latch circuit holds the resulting signal. The signal held by the latch circuit is converted to an analog voltage by the digital-to-analog converter with corrective function, so that the analog voltage obtained through the conversion controls the voltage-controlled oscillator. When the lock detector does not detect the matching in phase of the internal clock and the external clock, the D/A converter with corrective function does not perform a correction. When the lock detector detects the matching in phase of the internal clock and the external clock, the D/A converter with corrective function corrects the analog voltage. When the generation of the internal clock, which has temporarily been halted is to be resumed, the voltage-controlled oscillator is controlled based on the signal held by the latch circuit.

A digital circuit apparatus according to a second invention has: a sampling circuit for sampling an analog voltage outputted from a control voltage generator in relation to the difference in phase between an internal clock and the external clock; a counter to which the output of the sampling circuit is inputted; a digital-to-analog converter to which the count output of the counter is to be inputted; and a lock detector for detecting the matching in phase of the clock outputted from the controlled-voltage oscillator and the external clock. According to the second invention, the analog voltage generated in relation to the phase difference between the internal clock and the external clock is sampled by the sampling circuit. The output of the sampling circuit is counted by the counter. The count value of the counter is converted to an analog voltage by the D/A converter with corrective function, so that the analog voltage obtained through the conversion controls the voltage-controlled oscillator. When the lock detector does not detect the matching in phase of the internal clock and the external clock, the D/A converter with corrective function does not perform a correction. When the lock detector detects the matching in phase of the internal clock and the external clock, the D/A converter with corrective function corrects the analog voltage. When the generation of an internal clock, which has temporarily been halted, is to be resumed, the voltage-controlled oscillator is controlled based on the count value of the counter.

A digital circuit apparatus according to a third invention has: a voltage control delay line circuit for delaying an external clock which has been inputted; a phase comparator for comparing the phase of the external clock with the phase of the delay output of the voltage control delay line circuit; and a control voltage generator for outputting a control voltage for controlling the amount of delay in the voltage control delay line circuit in accordance with the result of phase comparison. According to the third invention, the external clock is delayed in the voltage control delay line circuit. The phase of delay output of the voltage control delay line circuit is compared with the phase of the external clock. The control voltage outputted from the control voltage generator in accordance with the result of phase comparison controls the amount of delay so as to achieve the phase matching. When the supply of the external clock, which has temporarily been halted, is to be resumed, the control voltage is adjusted so as to minimize the amount of delay.

A digital circuit apparatus according to a fourth invention has: a wave number comparator for comparing the number of waves of the delay output of a voltage control delay line circuit with the number of waves of an external clock and outputting a wave-number comparison result signal; a counter for performing a count-up or count-down operation in response to the wave-number comparison result signal; a D/A converter for converting the count output of the counter to an analog voltage and outputting a control voltage for controlling the voltage-controlled delay line circuit; a lock detector for detecting the matching in number of waves of the wave-number comparison result signal and the external clock; and a selector for selecting the external clock or delay output in accordance with the locked state signal outputted from the lock detector. According to the fourth invention, the number of waves of the delay output of the voltage control delay line circuit, which was obtained by delaying and inverting the external clock, is compared with the number of waves of the external clock. The counter performs a count-up or count-down operation in accordance with the wave-number comparison result signal. The D/A converter converts the count output to an analog voltage, so that the analog voltage obtained through the conversion controls the voltage-controlled oscillator. The selector continues to select the delay output until the count value of the counter falls within a predetermined range. When the count, value falls within the predetermined range, the selector selects the external clock. When the supply of the external clock is to be resumed, the amount of delay in the voltage control delay line circuit is determined so as to correspond to the count value held by the counter.

A digital circuit apparatus according to a fifth invention has a wave number comparator for receiving a first signal and a second signal, each being a digital signal, comparing the numbers of waves of both signals, and outputting a first wave-number comparison result signal or a second wave-number comparison result signal. According to the fifth invention, the number of waves of the first signal is compared with the number of waves of the second signal so as to output the first wave-number comparison result signal or second wave-number comparison result signal in accordance with the result of wave-number comparison. When there occurred no transition in a predetermined direction of the second signal between a transition in a predetermined direction of the first signal, which is either of the transition from 0 to 1 or the transition from 1 to 0, and the subsequent transition in the same direction of the first signal, the first, wave-number comparison result signal is outputted in synchronization with the first signal. When a transition in a predetermined direction of the second signal occurred twice or more therebetween, the second wave-number comparison result signal is outputted in synchronization with the first signal. The first wave-number comparison result signal and second wave-number comparison result signal increases and decreases the count value of the counter, respectively. When the supply of the external clock is to be resumed, the amount of delay in the voltage control delay line circuit is determined so as to correspond to the count value held by the counter.

A digital circuit apparatus according to a sixth invention has: a counter for receiving a count-up signal, a count-down signal, and a count clock and outputting a count value; and a convergence judging circuit for receiving the count-up signal, the count-down signal, and the count clock and outputting a count convergence value. The convergence judging circuit has: a multi-stage shift register in which either of the count-up signal or the count-down signal is inputted to the first stage thereof; and a combinatorial logic circuit for receiving the output of each stage of the shift register and outputting a convergence judgment value. According to the sixth invention, the count value of the counter increases in synchronization with the count clock during the period in which the count-up signal is inputted, while the counter value decreases in synchronization with the count clock during the period in which the count-down signal is inputted. The convergence judging circuit performs a shift operation in synchronization with the count clock during the period in which the count-up signal or the count-down signal is inputted to the first stage of its shift register. The combinatorial logic circuit of the convergence judging circuit, compares, when the number of consecutive 1's or 0's in the output of each stage of the shift register reached a predetermined number or less, the wave numbers of both signals so as to detect the matching in number of waves thereof. When the supply of the external clock is to be resumed, the amount of delay in the voltage control delay line circuit is determined so as to correspond to the count value held by the counter.

Thus, each of the first to sixth inventions is constituted so as to hold phase information obtained when the internal clock and the external clock match in phase, resulting in a simple circuit configuration. Hence, the matching in phase of the external clock and the internal clock can be achieved in a short period of time in resuming the generation of the internal clock.

The above and further objects and features of the invention will more fully be apparent from the following detailed description with accompanying drawings.

DESCRIPTION OF THE PREFERRED EMBODIMENTS

Below, the embodiments of the present invention will be described in detail with reference to the drawings.
First Embodiment)

Figure 1:
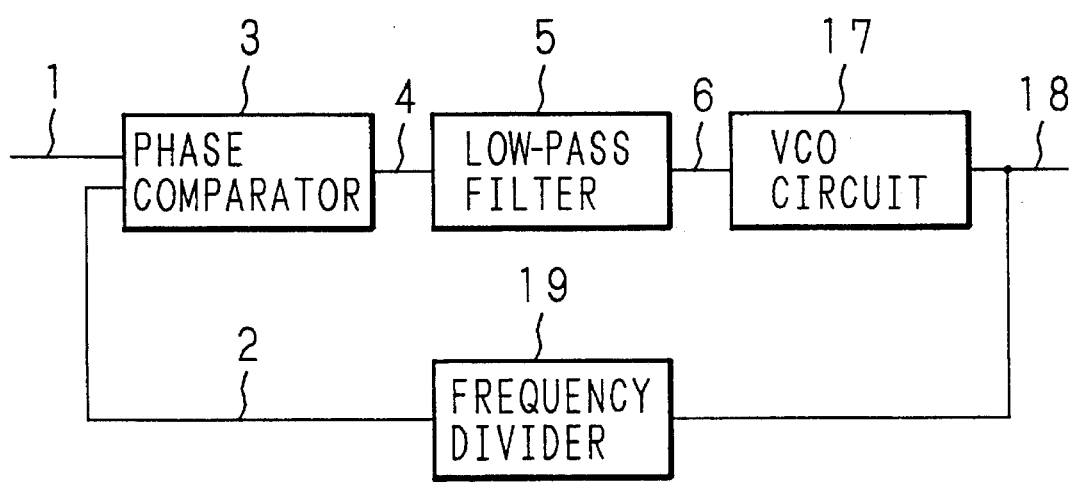
FIG. 1 is a block diagram showing the configuration of a conventional digital circuit apparatus.
Figure 2:
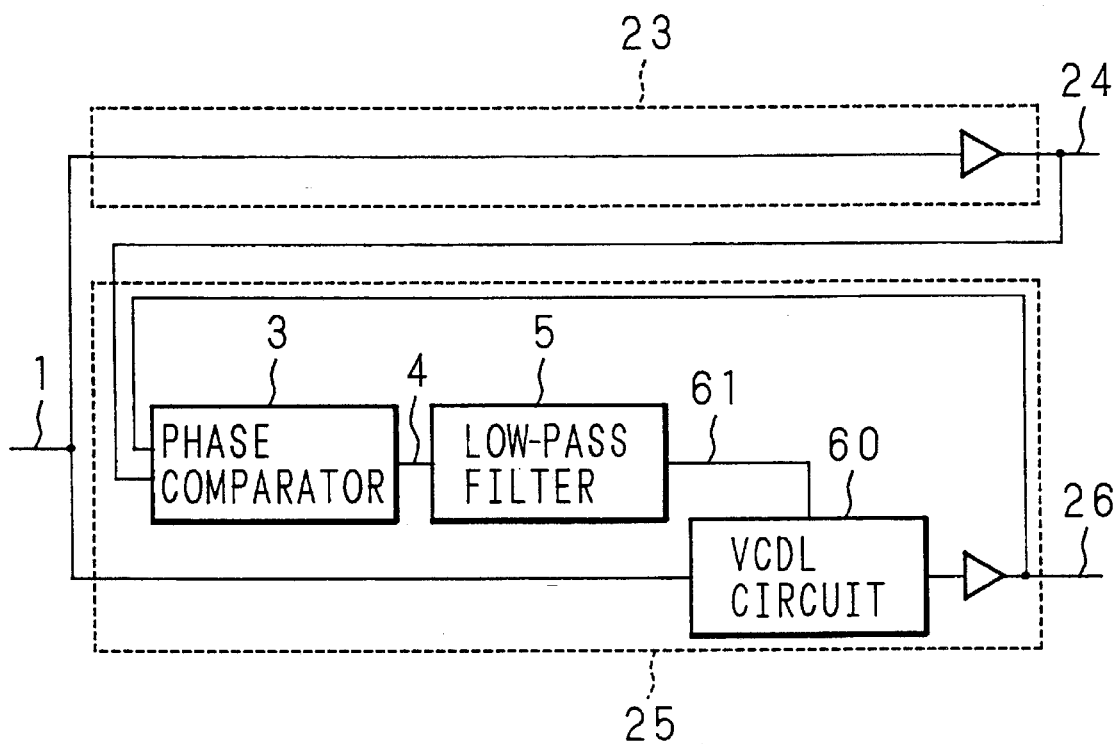
FIG. 2 is a block diagram showing the conventional digital circuit apparatus of another configuration.
Figure 3:
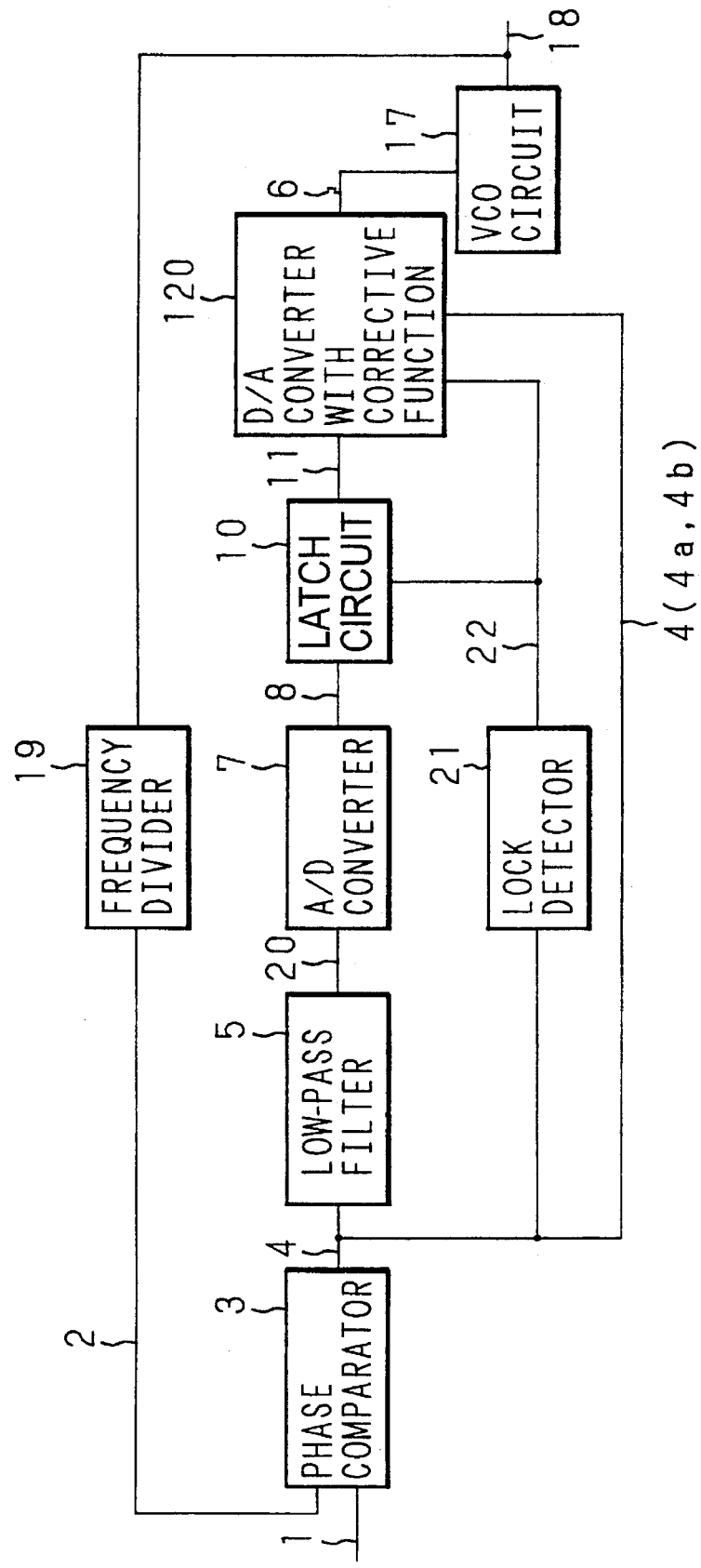
FIG. 3 is a block diagram showing the configuration of a digital circuit apparatus according to the present invention.

FIG. 3 is a block diagram showing the configuration of a digital circuit apparatus according to the present invention. An external clock 1 is inputted to one input terminal of a phase comparator 3. A phase comparison result signal 4 outputted from the phase comparator 3 is supplied to a low-pass filter 5, to a lock detector 21, and to a digital-to-analog (D/A) converter 120 with corrective function. An analog voltage signal 20 outputted from the low-pass filter circuit 5 is inputted to an analog-to-digital (A/D) converter 7, and a digital control signal 8 outputted from the A/D converter 7 is inputted to a latch circuit 10. A latch output signal 11 outputted from the latch circuit 10 is inputted to the D/A converter 120 with corrective function, and a V O voltage control signal 6 outputted from the D/A converter 120 is inputted to a VCO circuit 17. From the VCO circuit 17 is outputted an internal clock 18. The internal clock 18 is inputted to a frequency divider 19, and a divided frequency clock 2 outputted from the frequency divider 19 is inputted to the other input terminal of the phase comparator 3. A locked state signal 22 outputted from the lock detector 21 is supplied to the latch circuit 10 and to the D/A converter 120 with corrective function.

Next, a description will be given to the digital circuit apparatus thus constituted. The analog voltage signal 20 outputted from the low-pass filter 5 is inputted to the A/D converter 7, so that it is subjected to A/D conversion and then inputted to the latch circuit 10. The latch circuit 10 continues to output the inputted A/D conversion output signal 8 as the latch output signal 11 until the locked state, in which the divided frequency clock 2 is matched with the external clock 1 in phase, is detected under the control of the locked state signal 22 outputted from the lock detector 21. The latch output signal 11 is then inputted to the D/A converter 120 with corrective function, where it is subjected to D/A conversion so as to generate the VCO voltage control signal 6.

Meanwhile, the lock detector 21 monitors the phase comparison result signal 4 from the phase comparator 3, detects the locked state, and outputs the locked state signal 22. The locked state can be detected based on the fact, for example, that the number of times the phase comparison result signal 4 successively indicates a positive or negative phase difference does not surpass a specified number and that the duration of time during which the phase comparison result signal 4 continues to indicate the positive or negative phase difference does not surpass a specified period, either.

When the locked state was detected, the latch circuit 10 latches, under the control of the locked state signal 22, the value of the digital control signal 8 and holds the latch output signal 11. The digital value held by the latch circuit 10 is then inputted to the D/A converter 120 with corrective function. Since the D/A converter 120 with corrective function is supplied with the phase comparison result signal 4 and locked state signal 22 as well as the latch output signal 11, it operates as a low-pass filter during the period in which the locked state signal 22 is asserted, which will be described later. In this case, the output voltage of the D/A converter 120 with corrective function is limited to a specified narrow range including an analog value corresponding to the value of the latch output signal 11.

When the result of phase comparison between the divided frequency clock 2 and the external clock 1 shows a difference in phase, the D/A converter 120 with corrective function operates as a low-pass filter, based on the phase comparison result signal 4, so as to adjust the value of the VCO voltage control signal 6 inputted to the VCO circuit 17. In this manner, the divided frequency clock 1 eventually matches the external clock 1 in phase.

When the supply of the external clock 1 is halted, the digital value of the latch circuit 10 is held. Since the value of the output voltage of the D/A converter 120 with corrective function is limited to the vicinity of the digital value latched by the storage unit 10, the output of the D/A converter 120 in resuming the clock has a value in the vicinity of the value corresponding to the frequency of the external clock. Although the D/A converter 120 with corrective function operates as a low-pass filter, it is constituted so as to operate in a narrow range corresponding to the resolution of D/A conversion, so that, compared with the case where it operates in a wider range, it can operate stably even when the time constant of the circuit is decreased. Consequently, it becomes possible to reduce the time that has elapsed since the supply of the clock, which had temporarily been halted, is resumed till the phase matching is achieved.

Figure 4:
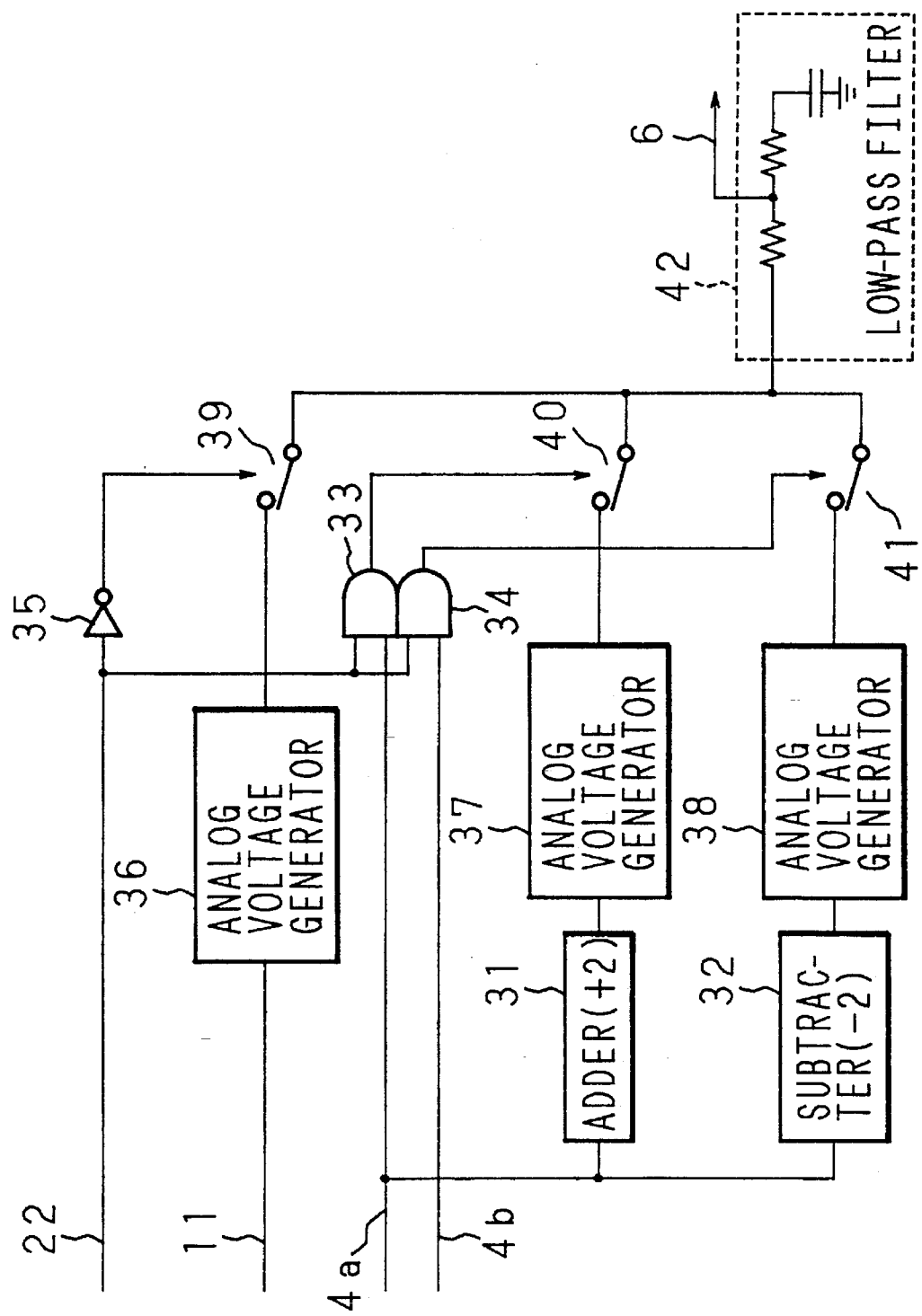
FIG. 4 is a block diagram showing the configuration of a digital-to-analog (D/A) converter with corrective function.

FIG. 4 is a block diagram showing the configuration of the D/A converter 120 with corrective function. The latch output signal 11 is inputted to an analog voltage generator 36, to an adder 31, and to a subtracter 32. A positive phase-correction signal 4a is inputted to one input terminal of an AND circuit 33, while a negative phase-correction signal 4b is inputted to one input terminal of an AND circuit 34. The locked state signal 22 is inputted to the other input terminals of the AND circuits 33 and 34.

The locked state signal 22 is given to a switch 39 via an inverter 35, so as to turn the switch 39 ON or OFF. The output signal from the AND circuit 33 is given to a switch 40, so as to turn the switch 40 ON or OFF. The output signal from the AND circuit 34 is given to a switch 41, so as to turn the switch 41 ON or OFF. The analog voltage outputted from an analog voltage generator 36 is inputted to a low-pass filter 42 via the switch 39. The analog voltage outputted from an analog voltage generator 37 composed of a D/A converter is inputted to the low-pass filter 42 via the switch 40. The analog voltage outputted from an analog voltage generator 38 composed of a D/A converter is inputted to the low-pass filter 42 via the switch 41. The low-pass filter 42 is constituted so as to output the VCO voltage control signal 6, which is an analog voltage.

Next, a description will be given to the operation of the D/A converter 120 with corrective function, on the assumption that the latch output signal 11 consists of 8 bits. The adder 31 generates a signal having a digital value by adding "2" to the digital value of the latch output signal 11. The subtracter 32 generates a signal having a digital value by subtracting "2" from the digital value of the latch output signal 11. To the analog voltage generators 36, 37, and 38 are inputted signals having the digital value, the digital value of the latch output signal plus 2, and the digital value of the latch output signal minus 2, respectively, so that the corresponding analog voltages are outputted therefrom.

During the period during which the locked state signal 22 indicates the unlocked state, the switch 39 is ON while the switches 40 and 41 are OFF, so that the analog voltage corresponding to the digital value of the latch output signal 11 is outputted from the low-pass Filter 42 as the VCO voltage control signal 6. When the locked state signal 22 indicates the locked state, on the other hand, the switch 39 is turned OFF. When each of the positive phase-correction signal 4a and negative phase-correction signal 4b inputted is "0," each of the switches 40 and 41 is turned OFF, while the VCO voltage control signal 6 maintains its current voltage.

When the locked state signal 22 is "1" and the positive phase-correction signal 4a is asserted, the switch 40 is turned on while the switch 41 is turned OFF, so that the voltage corresponding to the digital value of the latch output signal plus 2 is inputted to the low-pass filter 42, thereby raising the voltage of the VCO volt, age control signal 6. When the negative phase-correction signal 4b is asserted, on the other hand, the switch 40 is turned OFF while the switch 41 is turned ON, so that the voltage corresponding to the digital value of the latch output signal minus 2 is inputted to the low-pass filter 42, thereby lowering the voltage of the VCO voltage control signal 6.

Thus, the D/A converter 120 operates as a general D/A converter till phase locking is achieved through the matching in phase of the divided frequency clock and the external clock, while it operates as a low-pass filter having a smaller voltage range including an objective voltage after the phase locking.

Figure 5:
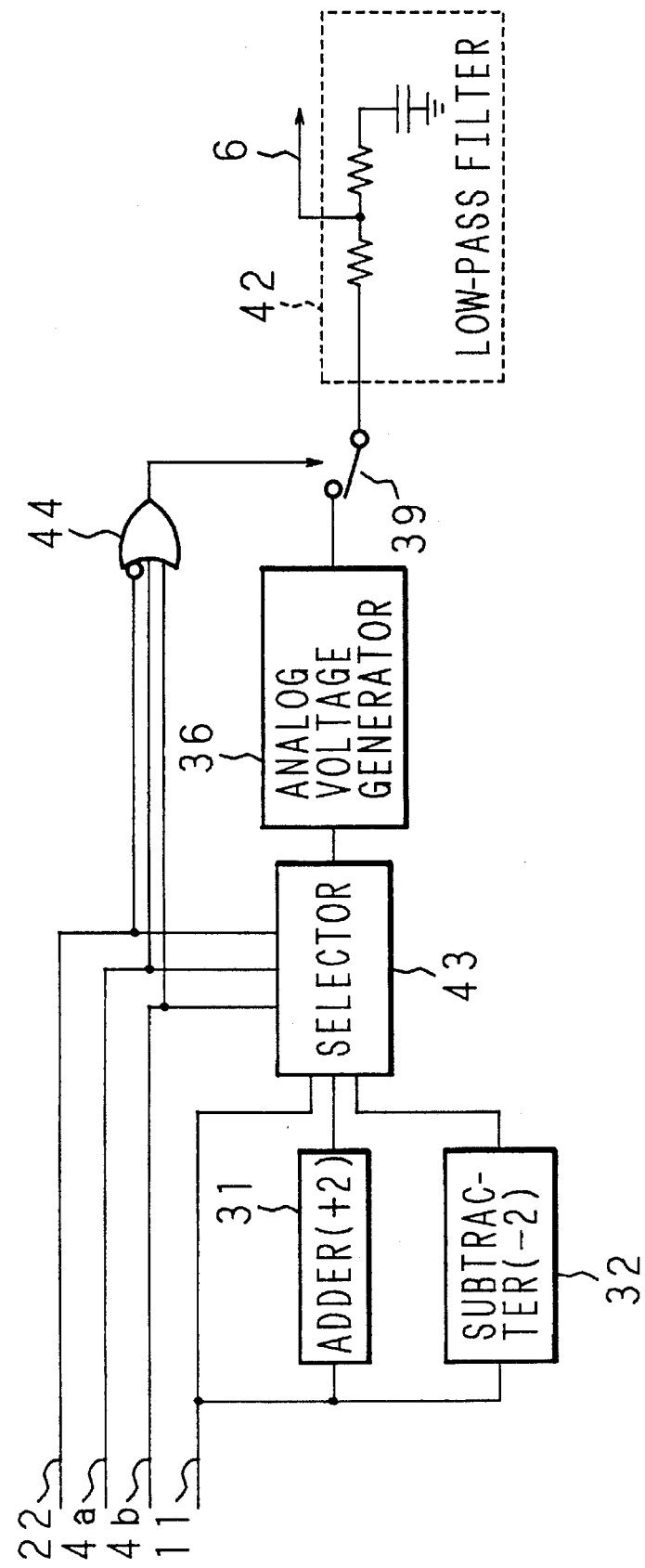
FIG. 5 is a block diagram showing the configuration of another embodiment of the D/A converter with corrective function.

FIG. 5 is a block diagram showing the configuration of another embodiment of the D/A converter 120 with corrective function. The latch output signal 11 is inputted to a selector 43, to the adder 31, and to the subtracter 32, so that a signal having the digital value of the latch signal plus 2 and a signal having the digital value of the latch signal minus 2, which are outputted from the adder 31 and subtracter 32, are inputted to the selector 43. The locked state signal 22, positive phase-correction signal 4a, and negative phase-correction signal 4b are inputted in parallel to the selector 43, while they are inputted to the first input terminal, the second input terminal, and the third input terminal in negative logic of a 3-input OR circuit 44, respectively.

The locked state signal 22, the signal having the digital value of the latch signal plus 2, or the signal having the digital value of the latch signal minus 2, which was selected by the selector 43, is inputted to the analog voltage generator 36. The analog voltage outputted from the analog voltage generator 36 is inputted to the low-pass filter 42 via the switch 39. From the low-pass filter 42 is outputted the VCO voltage control signal 6. The D/A converter with corrective function shown in FIG. 5 operates similarly to the D/A converter with corrective function shown in FIG. 4. In this case, each of the analog voltage generator 36 and switch 39 can be composed of a single element respectively.

(Second Embodiment)

Figure 6:
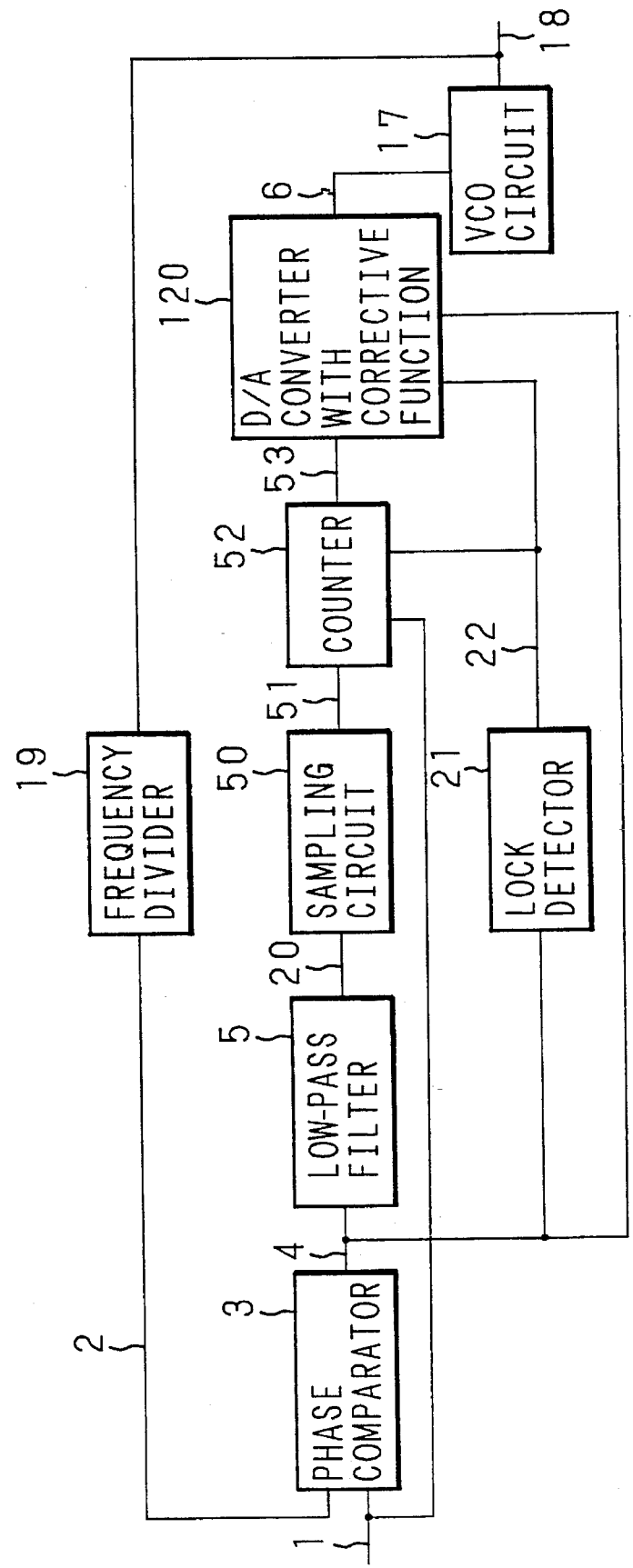
FIG. 6 is a block diagram showing the configuration of another embodiment of the digital circuit apparatus according to the present, invention.

FIG. 6 is a block diagram showing the configuration of another embodiment of the digital circuit apparatus according to the present invention. The analog voltage signal 20 outputted from the low-pass filter 5 is inputted to a sampling circuit 50, and a sample output signal 51 outputted from the sampling circuit 50 is inputted to a counter 52. The counter 52 is supplied with the external clock 1. A count output signal 53 outputted from the counter 52 is inputted to the D/A converter 120 with corrective function. The locked state signal 22 outputted from the lock detector 21 is supplied to the counter 52. Except for that, the digital circuit apparatus in the present embodiment is constituted similarly to the digital circuit apparatus (the first embodiment) shown in FIG. 3, in which like reference numerals designate like components.

Next, a description will be given to the operation of the digital circuit apparatus. When the digital circuit apparatus is energized, the VCO circuit 17 initiates oscillation at a frequency corresponding to the initial state of the VCO voltage control signal 6. The frequency of the internal clock 18 outputted from the VCO circuit 17 is divided by the frequency divider 19, so that the divided frequency clock 2 is generated. Both the divided frequency clock 2 and the external clock 1 are inputted to the phase comparator 3, where their phases are compared with each other. The phase comparison result signal 4 is inputted to the low-pass filter 5 having a small time constant so as to integrate the phase comparison result signal, thereby generating the analog voltage signal 20 having an analog value.

The analog voltage signal 20 is sampled by the sampling circuit 50 in response to the external clock 1, amplified, and converted to the sample output signal 51 having a 1-bit digital value. The sample output signal 51 corresponds to the result of phase comparison. Here, when the divided frequency clock 2 is ahead of the external clock 1 in phase, the value of the divided frequency clock 2 becomes "0." Conversely, when the divided frequency clock 2 is behind the external clock 1 in phase, the value of the divided frequency clock 2 becomes "1."

When the sample output signal 51 and the external clock 1 are inputted to the counter 52 and if the value of the sample output signal 51 is "0," the value of the count output signal 53 is decreased by "1" in synchronization with the external clock 1. When the value of the digital signal is "1," the value of the count output signal 53 is increased by "1" in synchronization with the external clock 1. The count output signal 53 is inputted to the D/A converter 120 with corrective function so as to generate the VCO voltage control signal 6, which is an analog voltage.

The D/A converter 120 with corrective function operates similarly to the digital circuit apparatus (the first embodiment) shown in FIG. 3 in the course of reaching the locked state in which the divided frequency clock matches the external clock in phase, after locking was achieved, and when the supply of the clock is halted or resumed. As the result of the operation of the D/A converter 120, the matching in phase of the external clock 1 and divided frequency clock 2 is achieved as well as the supply of the clock, which has been halted, can be resumed promptly.

(Third Embodiment)

Figure 7:
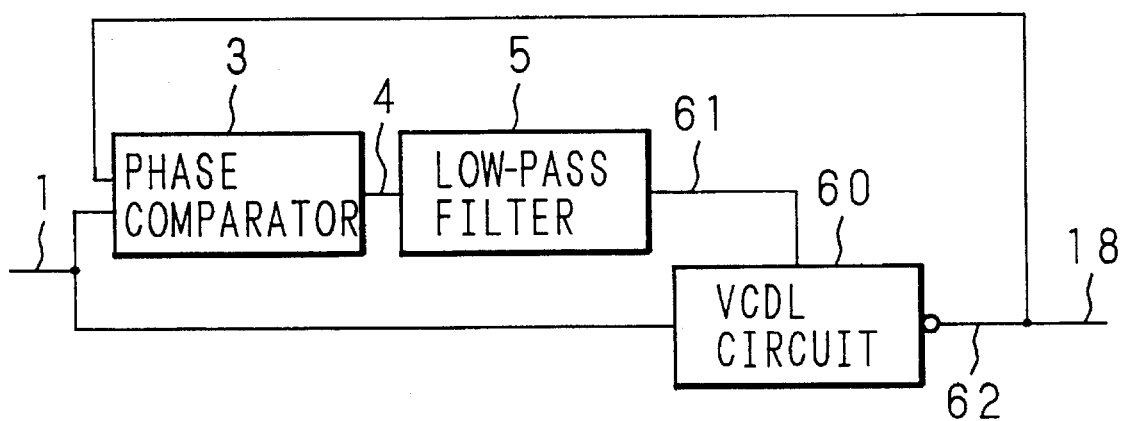
FIG. 7 is a block diagram showing the configuration of further another embodiment of the digital circuit apparatus according to the present invention.

FIG. 7 is a block diagram showing the configuration of Further another embodiment of the digital circuit apparatus according to the present invention. The external clock 1 is inputted to one input terminal of the phase comparator 3 and to the VCDL circuit 60. From the VCDL circuit 60 is outputted the internal clock 18 as an VCDL output signal 62. The VCDL output signal 62 is inputted to the other input terminal of the phase comparator 3, and the phase comparison result signal 4 outputted from the phase comparator 3 is inputted to the low-pass filter 5. The VCDL voltage control signal 61 outputted from the low-pass filter 5 is supplied to the VCDL circuit 60.

Next, a description will be given to the operation of the digital circuit apparatus. When the external clock 1 is inputted to the VCDL circuit 60, the VCDL circuit 60 supplies the external clock 1 with the amount of delay determined by the VCDL voltage control signal 61, so as to output the VCDL output signal 62 (internal clock 18) by inverting the delayed external clock. Before initiating the operation of displacing the phases, a means (not shown) initializes the VCDL voltage control signal 61 to a value corresponding to the minimum amount of delay of the VCDL circuit 60. The control voltage can be initialized by, e.g., adding a pull-up transistor, which is operable by resetting at the time of energization, to the low-pass filter 5 so as to initialize the output of the low-pass filter 5 to the power-supply potential.

The phase comparator 3 compares the phase of the external clock 1 with that of the VCDL output signal 62. Since the VCDL output signal 62 has been inverted by the VCDL circuit 60, it follows that the phase comparator 3 compares, e.g., the rising edge of the external clock 1 with the rising edge of the VCDL circuit 62, which is 180° out of phase with the rising edge of the external clock 1. After initialization, the operation is initiated in the state in which the VCDL output signal 62 is slightly behind the external clock 1. Since the VCDL output signal 62 has been inverted, it follows that the phase comparison result signal indicates that the VCDL output signal 62 is ahead of the external clock 1 by nearly half a clock cycle.

When the phase comparison result signal 4 indicates the lead of the VCDL output signal 62, the VCDL voltage control signal 61 outputted from the low-pass filter 5 is lowered so that the amount of delay in the VCDL circuit 60 is increased. When the amount of delay in the VCDL circuit 60 surpasses half a clock cycle, the phase comparator 3 outputs the phase comparison result signal 4 indicating the delay of he VCDL output signal 62, which raises the output voltage of the low-pass filter 5 and decreases the amount of delay in the VCDL circuit 60. Thus, after the time required to match the phases elapsed, the matching in phase of the VCDL output signal 62 and the external clock 1 is achieved.

Since the digital circuit apparatus shown in FIG. 7 operates in the manner as described above, it can provide the effect of matching, from the very beginning of the operation of the circuit, the frequency of the external clock 1 and the frequency of the VCDL output signal 62 serving as the internal clock 18.

(Fourth Embodiment)

Figure 8:
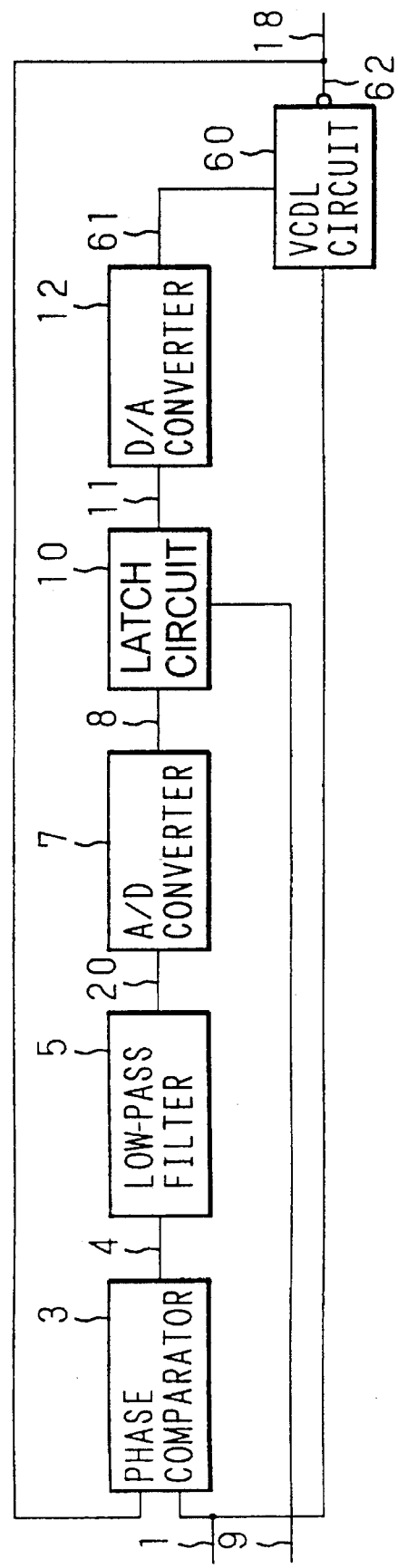
FIG. 8 is a block diagram showing the configuration of further another embodiment of the digital circuit apparatus according to the present invention.

FIG. 8 is a block diagram showing the configuration of further another embodiment of the digital circuit apparatus according to the present invention. The analog voltage signal 20 outputted from the low-pass filter 5 is inputted to the A/D converter 7. The digital control signal 8 outputted from the A/D converter 7 is inputted to the latch circuit 10. The latch output signal 11 outputted from the latch circuit 10 is inputted to a D/A converter 12, and the VCDL voltage control signal 61 outputted from the D/A converter 12 is supplied to the VCDL circuit 60. The latch circuit 10 is supplied with the latch control signal 9. Except for that, the configuration of the digital circuit apparatus of the present embodiment is the same as that of the digital circuit apparatus (the third embodiment) shown in FIG. 7, in which like reference numerals designate like components.

Next, a description will be given to the operation of the digital circuit apparatus. Although the operation of the digital circuit apparatus is the same as that of the digital circuit apparatus (the third embodiment) of FIG. 7 in initiating the adjusting of phase shift, it is different in that the analog voltage signal 20 from the low-pass filter 5 is subjected to A/D conversion performed by the A/D converter 7, instead of controlling the VCDL circuit 60 as it is, and that the VCDL voltage control signal 61 obtained through D/A conversion performed in the D/A converter 12 via the latch circuit 10 controls the VCDL circuit 60. Therefore, the latch circuit 10 continues to allow the digital control signal 8 inputted from the A/D converter 7 to pass therethrough until the locked state is detected.

When the external clock 1 and VCDL output signal 62 match in phase, a lock detecting means (not shown) asserts the latch control signal 9, so that the latch circuit 10 latches, in response to the latch control signal 9, the value of the digital control signal 9 and holds it. The phase information latched by the latch circuit 10 is held irrespective of the halting of the generation of the internal clock.

In resuming the clock, the VCDL circuit 60 operates in accordance with the amount of delay determined by the VCDL voltage control signal 61, which was obtained by subjecting the phase information latched by the latch circuit 10 to D/A conversion. Since the amount of delay is the value obtained at the phase matching, the phase of the VCDL output signal 62 is kept matched with the phase of the external clock 1 unless the frequency of the VCDL output signal 62, i.e., the internal clock 18 changes.

According to the embodiment using the VCDL circuit, even if a quantization error exists in the case of the A/D conversion, the error is simply added to the delay from the external clock 1 to the VCDL voltage control signal 61 and it does not affect the next clock cycle. Hence, the embodiment using the VCDL circuit is advantageous in that it need not compensate the accumulation of quantization errors.

(Fifth Embodiment)

Figure 9:
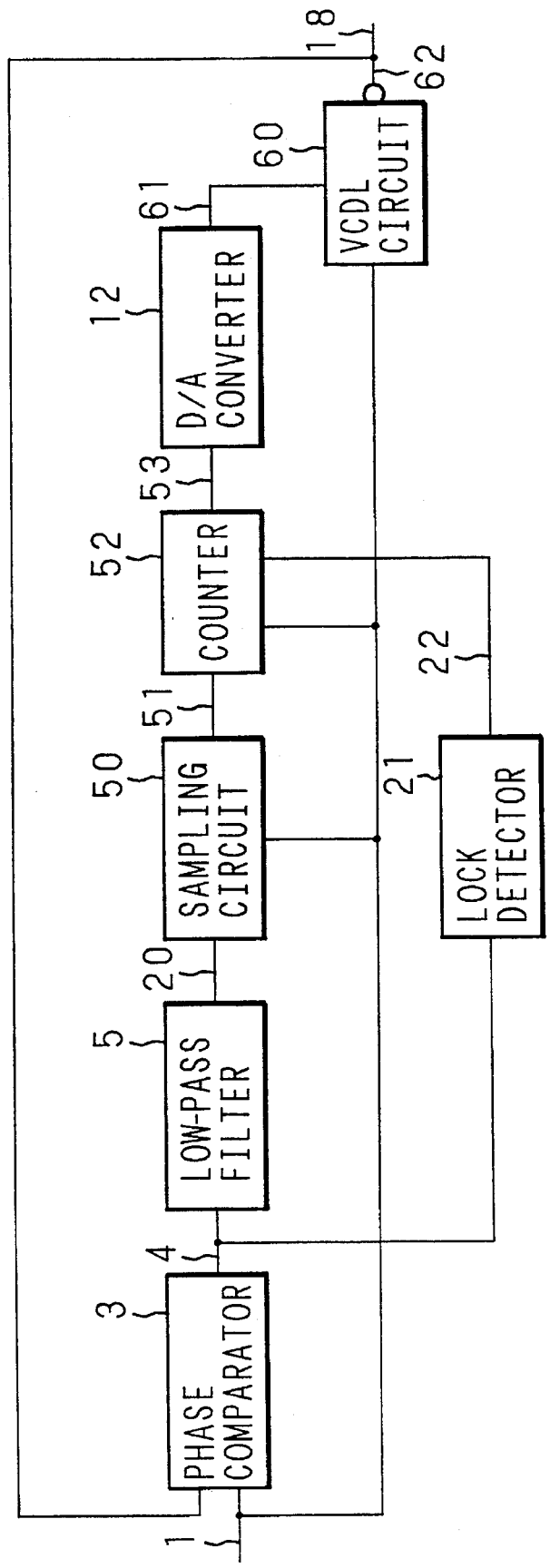
FIG. 9 is a block diagram showing the configuration of further another embodiment, of the digital circuit apparatus according to the present invention.

FIG. 9 is a block diagram showing the configuration of Further another embodiment, of the digital circuit apparatus according to the present invention. The external clock 1 is inputted to one input terminal of the phase comparator 3, to the sampling circuit 50, to the counter 52, and to the VCDL circuit 60. The phase comparison result signal 4 outputted from the phase comparator 3 is inputted to the low-pass filter 5 and to the lock detector 21. The analog voltage signal 20 outputted from the low-pass filter 5 is inputted to the sampling circuit 50, and the sample output signal 51 outputted from the sampling circuit 50 is inputted to the counter 52. The count output signal 53 outputted from the counter 52 is inputted to the D/A converter 12, and the VCDL voltage control signal 61 outputted from the D/A converter 12 is supplied to the VCDL circuit 60. From the VCDL circuit 60 is outputted the internal clock 18 composed of the VCDL output signal 62. The VCDL output signal 62 is inputted to the other input terminal of the phase comparator The locked state signal 22 outputted from the lock detector 21 is supplied to the counter In the digital circuit apparatus of the present embodiment, the operation of adjusting phase shift is performed similarly to the operation of the digital circuit apparatus (the third embodiment) shown in FIG. 7, while the operation of holding phase information after the phase matching was achieved similarly to the operation of the digital circuit apparatus (the second embodiment) shown in FIG. 6. Since the accumulation of quantization errors does not occur due to the VCDL circuit 60 used therein, it is not necessary to add a corrective function to the D/A converter, similarly to the digital circuit apparatus (the third embodiment) shown in FIG. 7. Moreover, since the digital circuit apparatus of the present embodiment does not use the A/D converter which is used in the digital circuit (the fourth embodiment) shown in FIG. 8, the area which might have been occupied by the A/D converter 7 can be saved, thereby miniaturizing the digital circuit.

(Sixth Embodiment)

Figure 10:
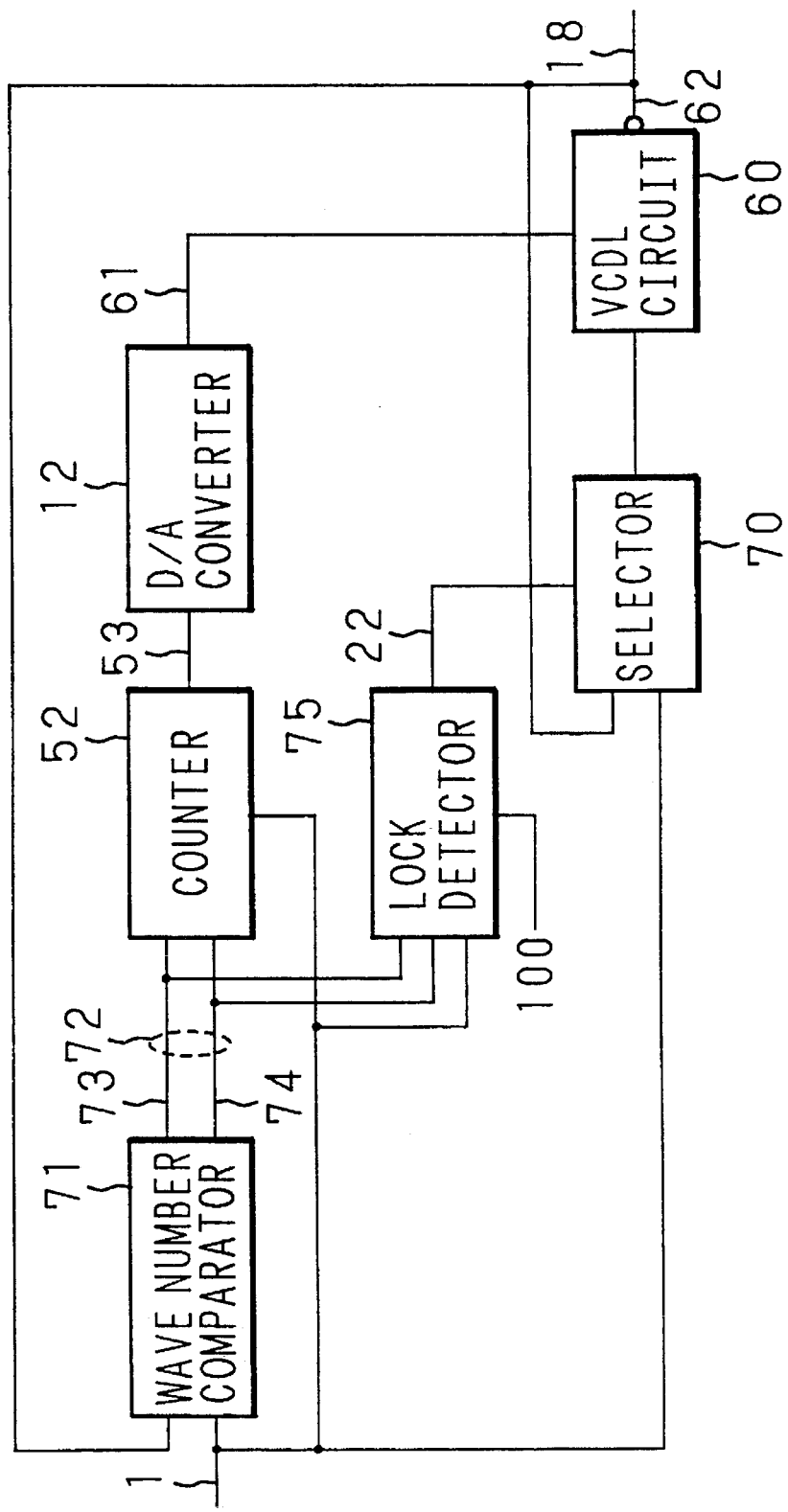
FIG. 10 is a block diagram showing the configuration of further another embodiment of the digital circuit apparatus according to the present invention.

FIG. 10 is a block diagram showing the configuration of further another embodiment of the digital circuit apparatus according to the present invention. The external clock 1 is inputted to a wave number comparator 71 and to the selector 70 so as to be supplied to the counter 52 and to a lock detector 75. A count-down signal 73 and a count-up signal 74, each composed of a wave-number comparison result signal 72 outputted from the wave number comparator 71 is inputted to the counter 52 and to the lock detector 75. To the lock detector 75 is given a reset signal 100 from a CPU (not shown). The count output signal 53 outputted from the counter 52 is inputted to the D/A converter 12. The VCDL voltage control signal 61 outputted from the D/A converter 12 is given to the VCDL circuit 60. The locked state signal 22 outputted from the lock detector 75 is given to the selector 70. A selection result signal selected by the selector 70 is inputted to the VCDL circuit 60. From the VCDL circuit 60 is outputted the internal clock 18 composed of the VCDL output signal 62. The VCDL output signal 62 is inputted to the other input terminal of the wave number comparator 71.

Next, a description will be given to the operation of the digital circuit apparatus. First, the operation prior to locking will be described. When the digital circuit apparatus is energized, the VCDL circuit 60 initiates operation in accordance with the amount of delay corresponding to the initial state of the VDCL voltage control signal 61. Meanwhile, the selector 70 selects the VCDL output signal 62 in the initial state and inputs it to the VCDL circuit 60. The VCDL output signal 62 was obtained by delaying and inverting the signal inputted to the VCDL circuit 60. At this stage, the loop of a circuit containing the VCDL circuit 60 and the selector 70 functions as a VCO (voltage-controlled oscillator).

Both VCDL output signal 62 and external clock 1 are inputted to the wave number comparator 71 so that the number of waves of both signals are compared with each other in every cycle of the external clock 1. When there are two falling edges of the VCDL output signal 62 in one cycle of the external clock 1, the count-down signal 73 is asserted. When there is one falling edge of the VCDL output signal 62 in one cycle of the external clock 1, each of the count-down signal 73 and the count-up signal 74 is negated. When there is no falling edge of the VCDL output signal 62 in one cycle of the external clock 1, the count-up signal 74 is asserted. These count-down signal 73 and count-up signal 74 are inputted to the counter 52 which increases, when the count-up signal 74 is asserted, the value of the count output signal 53 in synchronization with the external clock 1 and which decreases, when the count-down signal 73 is asserted, the value of the count output signal 53 in synchronization with the external clock 1.

The count output signal 53 of the counter 52 is inputted to the D/A converter 12 so as to generate the VCDL voltage control signal 61 having an analog value. Under the control of the VCDL voltage control signal 61, the VCDL circuit 60 adjusts the phase shift between the VCDL output signal 62 and the external clock 1.

Next, the operation after locking will be described. The lock detector 75 detects the locked state based on the count down signal 73 and count-up signal 74 so as to output the locked state signal 22. The locked state here is defined as a state in which the frequency of the external clock 1 matches the frequency of the VCDL output signal 62 except for the quantization error. The locked state is reached when the amount of delay in the VCDL circuit 60 becomes half the cycle of the external clock 1. In this case, the VCDL circuit 60 oscillates at the same frequency as the external clock 1. The locked state can be detected based on the fact that each of the count-down signal 73 and the count-up signal 74 cannot be generated successively over a specified number of times.

When the locked state signal 22 inputted to the selector 70 is asserted, the selector 70 selects the external clock 1 so that it is inputted to the VCDL circuit 60. As a result, the VCDL circuit 60 operates as a delay circuit for the external clock 1. Since the VCDL output signal 62 and external clock 1 have the same frequency after the selector 70 was switched, the locked state signal 22 remains asserted.

In the locked state, the amount of delay in the VCDL circuit 60 is half the cycle of the external clock 1, as described above. Moreover, since the VCDL output signal 62 has been inverted in the VCDL circuit 60, it has the same frequency and phase as those of the external clock 1. When the supply of the external clock 1 is halted in this state, the operation of the counter 52 is also halted, so that the count value, i.e., the counter output signal 53 is held. In resuming the supply of the external clock 1, the VCDL circuit 60 also resumes operation in accordance with the amount of delay corresponding to the count value, so that the VCDL output signal 62 having the same frequency and phase as those of the external clock 1 can be obtained only half a clock cycle after the supply of the external clock 1 was resumed.

Figure 11:
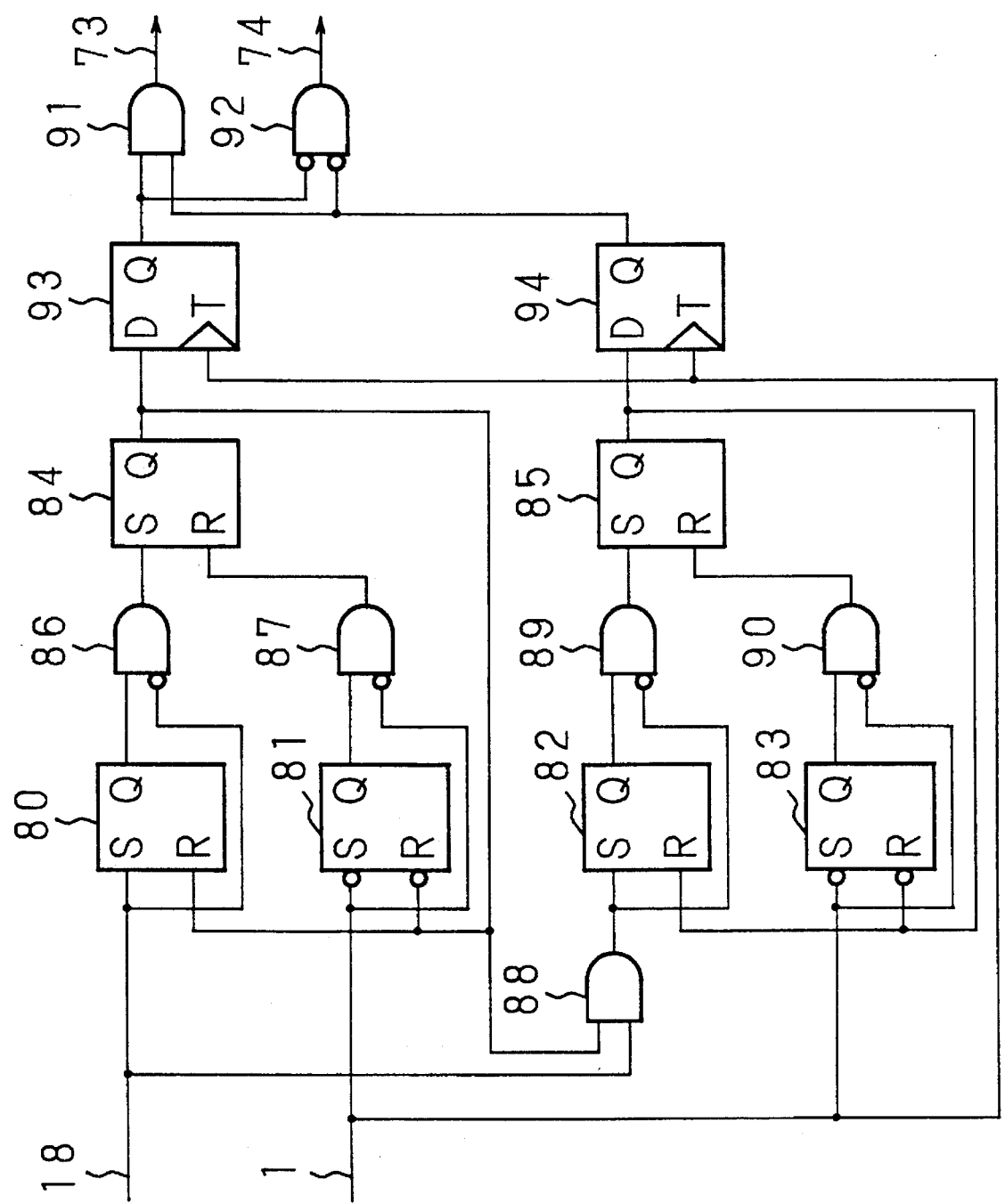
FIG. 11 is a block diagram showing the configuration of a wave number comparator.

FIG. 11 is a block diagram showing the configuration of the wave number comparator 71 of FIG. 10. The internal clock 18 is input ted to the set terminal S of an RS flip-flop 80, to one input terminal in negative logic of an AND circuit 86, and to one input terminal of an AND circuit 88. The output from the output terminal Q of the RS flip-flop 80 is inputted to the other input terminal of the AND circuit 86, and the output of the AND circuit 86 is inputted to the set terminal S of an RS flip-flop 84. The output from the output terminal Q of the RS flip-flop 84 is inputted to the other input terminal of the AND circuit 88, to the reset terminal R of the RS flip-flop 80, to the reset terminal R in negative logic of an RS flip-flop 81, and to the input terminal D of a D flip-flop 93. The output from the output terminal Q of the D flip-flop 93 is inputted to one input terminal of an AND circuit 91 and to one input terminal in negative logic of an AND circuit 92.

The count-down signal 73 is outputted from the AND circuit 91, while the count-up signal 74 is outputted from the AND circuit 92. The external clock 1 is inputted to the set terminal S in negative logic of the RS flip-flop 81, to one input terminal of an AND circuit 87, to the set terminal S in negative logic of an RS flip-flop 83, to one input terminal of an AND circuit 90, and to the respective trigger terminals T of the D flip-flops 93 and 94. The output of the AND circuit 88 is inputted to the set terminal S of an RS flip-flop 82 and to one input terminal in negative logic of an AND circuit 89. The output from the output terminal Q of the RS flip-flop 82 is inputted to the other input terminal of the AND circuit 89, and the output of the AND circuit 89 is inputted to the set terminal S of an RS flip-flop 85. The output from the output terminal Q of the RS flip-flop 85 is inputted to the input terminal D of a D flip-flop 94, to the reset terminal R of the RS flip-flop 82, and to the reset terminal R in negative logic of the RS flip-flop 83. The output from the output terminal Q of the RS flip-flop 83 is inputted to the other input terminal of the AND circuit 90, and the output of the AND circuit 90 is inputted to the reset terminal of the RS flip-flop 85. The output from the output terminal Q of the D flip-flop 94 is inputted to the other input terminal of the AND circuit, 91 and to the other input terminal in negative logic of the AND circuit 92.

Next, a description will be given to the operation of the wave number comparator. First, the initiating operation at the rising edge of the external clock 1 will be described. The RS flip-flops 81 and 83 are set during the period in which the external clock 1 remains "0" till it rises. Next, when the external clock 1 rises, the logic between the outputs of the RS flip-flops 81 and 83 and the external clock 1 is determined, so that the outputs of the AND circuits 87 and 90 become "1" and the RS flip-flops 84 and 85 are reset. When the output from the output terminal Q of the RS flip-flop 84 becomes "1," the RS flip-flop 81 is reset. When the output from the output terminal Q of the RS flip-flop 85 becomes "1," the RS flip-flop 83 is reset.

Next, the operation at the falling edge of the internal clock will be described. The RS flip-flops 80 and 82 are set during the period in which the internal clock 18 remains "1" till it falls. When the internal clock 18 falls subsequently, the output from the out, put terminal Q of the AND circuit 86 becomes "1" and the RS flip-flop 84 is set. Since the output from the output terminal of Q of the RS flip-flop 84 remains "0" after the external clock 1 fell till the first rising edge of the internal clock 18, the output of the AND circuit 88 to which the output of the RS flip-flop 84 and the internal clock 18 have been inputted is "0," so that the RS flip-flop 85 is not set even when the internal clock 18 falls.

When the internal clock 18 falls once more by the time the external clock 1 rises subsequently, the output of the AND circuit 88 becomes "1" on the falling edge of the internal clock 18, since the output of the RS flip-flop 84 has already been set, thereby setting the RS flip-flop 85. Thus, when there is one falling edge of the internal clock between one rising edge of the external clock 1 and the subsequent rising edge thereof, the output from the output terminal Q of the RS flip-flop 84 is set. When there are two or more falling edges between the two consecutive rising edges of the external clock 1, the output of the RS flip-flop 85 is set as well.

Next, a description will be given to the sampling operation at the rising edge of the external clock 1. The output of the RS flip-flop 84 is sampled by the D flip-flop 93 on the subsequent rising edge of the external clock, while the output of the RS flip-flop 85 is sampled by the D flip-flop 94. A value combination "0, 0" of the signals sampled by the D flip-flops 93 and 94 indicates that there was no falling edge of the internal clock 18 between the previous rising edge of the external clock i and the present rising edge thereof. A value combination "0, 1" indicates that there was one falling edge of the internal clock 18 between the two consecutive rising edges of the external clock 1. A value combination "0, 0" indicates that, there were two or more falling edges of the internal clock 18 between the two consecutive rising edges of the external clock 1.

The outputs of the D flip-flops 93 and 94 are inputted to the AND circuits 91 and 92. When the combination of the signals is "0, 0," the count-up signal 74 is asserted. When the combination of the signals is "1, 1," the count-down signal 73 is asserted. In this manner, the wave number comparator of FIG. 11 functions to compare the number of waves of the two clock waveforms of the external clock 1 and the internal clock 18. The count-up signal 74 and the count-down signal 74, each indicating the result of wave-number comparison, are synchronized with the external clock 1, so that they will be used conveniently if the circuit synchronized with the external clock is used thereafter.

When the output of the wave number comparator 71 of FIG. 10 is to be counted by an up-down counter in practice, a count-down pulse and a count-up pulse can be generated by means of an AND circuit (not shown) to which the outputs of the AND circuits 91 and 92, each indicating the result of wave-number comparison, and the signal obtained by inverting the external clock 1 are to be inputted. In this case, the pulse widths and pulse intervals of the count-up pulse and count-down pulse can be set equal to or more than the pulse width and pulse interval of the external clock 1, so that secure counting operation can be performed.

Figure 12:
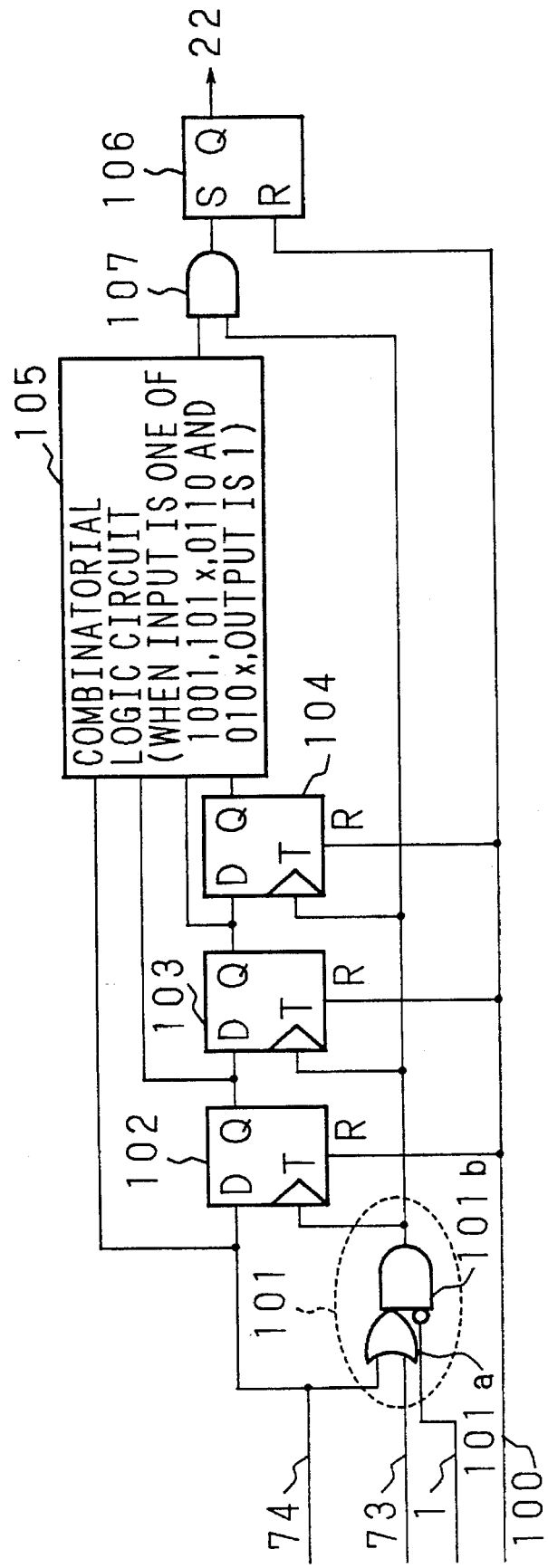
FIG. 12 is a block diagram showing the configuration of a lock detector.

FIG. 12 is a block diagram showing the configuration of the lock detector 75 of FIG. 10. The count-up signal 74 is inputted to the input terminal D of a D flip-flop 102, to one input terminal of an OR circuit 101a constituting a gate circuit 101, and to a combinatorial logic circuit 105. The count-down signal 73 is inputted to the other input terminal of the OR circuit 101a. The external clock 1 is inputted to the other input terminal in negative logic of an AND circuit 101b which constitutes the gate circuit 101, and receives at one input terminal thereof the output of the OR circuit 101a. The output of the AND circuit 101b is inputted to the respective trigger terminals T of the D flip-flops 102, 103, and 104 constituting a shift register and to one input terminal of an AND circuit 107. The output from the output terminal Q of the D flip-flop 102 is inputted to the input terminal D of the D flip-flop 103 and to the combinatorial logic circuit.

The output from the output terminal Q of the D flip-flop 103 is inputted to the input terminal D of the D flip-flop 104 and to the combinatorial logic circuit 105. The output from the output terminal Q of the D flip-flop 104 is inputted to the combinatorial logic circuit 105. The output of the combinatorial logic circuit 105 is inputted to the other input terminal of the AND circuit, 107. The output of the AND circuit 107 is inputted to the set terminal S of an RS flip-flop 106. The output from the output terminal Q of the flip-flop 106 serves as the locked state signal 22. A reset, signal 100 is inputted to the respective reset terminals R of the D flip-flops 102, 103, 104 and 106.

Next, a description will be given to the operation of the lock detector 75. When the reset signal 100 is inputted, the D flip-flops 102, 103, and 104 and the RS flip-flop 106 are reset, so that each of ! their outputs becomes "0." When either of the count-down signal 73 and count-up signal 74 is asserted, the D flip-flops 102, 103, and 104 sample the inputs in synchronization with the falling edge of the external clock 1 by the action of the gate circuit 101. Since the D flip-flops 102, 103, and 104 are connected in series, they operate as a shift register.

When the count-up signals 74 are successively asserted, for example, every time the external clock 1 falls, the D flip-flops 102, 103, and 104 transfer "1" in the direction of the D flip-flop 104 by one stage at a time. When the count-down signals 73 are successively asserted, on the other hand, the D flip-flops 102, 103, and 104 transfer "0" in the same manner.

When the order in magnitude of the frequency of the external clock 1 and the frequency of the internal clock 18 is reversed during the operation of comparing the numbers of waves, the signal to be asserted is switched between the count-up signal 74 and count-down signal 73 inputted to the circuit shown in FIG. 12. When the count-down signal 73 and count-up signal 74 are alternately asserted every clock cycle, for example, the outputs of the D flip-flops 102, 103, and 104 alternately become "1" and "0."

When the frequencies of the external clock 1 and internal clock 18 become substantially equal to each other so as to assert the count-down signal 73 and count-up signal. 74 alternately, the total of assertion periods for the count-down signal 73, each interposed between two assertion periods for the count-up signal 74, becomes short as well as the total of assertion periods for the count-up signal 74, each interposed between two assertion periods for the count-down signal 73, becomes short.

In the case shown in FIG. 12, when the assertion period for either of the count-up signal 74 and count-down signal 73 is complete within two clock cycles, the locked state is detected, by the action of the combinatorial logic circuit 105, so as to set the RS flip-flop 106. When the frequency of the external clock 1 is close to the frequency of the internal clock 18, the periods in which neither count-down signal nor count-up signal is asserted increase, and the count-down signal and the count-up signal are asserted in the intervals of such periods. During the periods in which neither count-down signal nor count-up signal is asserted, the transfer clock for the D flip-flops 102, 103, and 104 is not asserted by the action of the gate circuit 101, so that the D flip-flops functioning similarly to a shift register do not operate, thereby performing an effective judgment with D flip-flops of a small number of stages.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A digital circuit apparatus, comprising:

voltage-controlled oscillating means for outputting a clock at a frequency corresponding to a control voltage;

phase comparing means for comparing the phase of the clock outputted from said voltage-controlled oscillating means with the phase of an external clock inputted from the outside;

a control voltage generator for receiving a signal indicating the result of phase comparison and outputting a control voltage for controlling said voltage-controlled oscillating means;

an analog-to-digital converter for subjecting the analog voltage outputted from said control voltage generator to analog-to-digital conversion;

a latch circuit, connected to the analog-to-digital converter, for storing a digital signal obtained through the analog-to-digital conversion;

a digital-to-analog converter with corrective function, connected to the latch circuit, for receiving a signal read out of said latch circuit; and a lock detector, connected to the phase comparing means, to the latch circuit and to the digital-to-analog converter with corrective function, for detecting the matching in phase of the clock outputted from said voltage-controlled oscillating means and the external clock.

2. A digital circuit apparatus according to claim 1, wherein said digital-to-analog converter with corrective function receives an analog-output positive-correction control signal and an analog-output negative-correction control signal, generates a first corrected digital value and a second corrected digital value by adding a predetermined positive digital value to the inputted digital value and by adding a predetermined negative digital value to the inputted digital value, respectively, and outputs a first analog voltage obtained through the conversion of the first corrected digital value to an analog voltage during the period in which the analog-output positive correction control signal is asserted or outputs a second analog voltage obtained through the conversion of the second corrected digital value to an analog voltage during the period in which the analog-output negative-correction control signal is asserted.

3. A digital circuit apparatus, comprising:

voltage-controlled oscillating means for outputting a clock at a frequency corresponding to a control voltage;

phase comparing means for comparing the phase of the clock outputted from said voltage-controlled oscillating means with the phase of an external clock inputted from the outside;

a control voltage generator for receiving a signal indicating the result of phase comparison and outputting a control voltage for controlling said voltage-controlled oscillating means;

a sampling circuit for sampling the control voltage outputted from said control voltage generator;

a counter, connected to the sampling circuit, for receiving the output of said sampling circuit;

a digital-to-analog converter with corrective function, connected to the counter, for receiving a count output of said counter; and a lock detector, connected to the phase comparing means, to the counter and to the digital-to-analog converter with corrective function, for detecting the matching in phase of the clock outputted from said voltage-controlled oscillating means and the external clock.

4. A digital circuit apparatus comprising:

voltage control delay line means for delaying an external clock which has been inputted;

phase comparing means for comparing the phase of the external clock with the phase of a delay output of said voltage control delay line means; and a control voltage generator for outputting a control voltage for controlling the amount of delay for said voltage control delay line means in accordance with the result of phase comparison, wherein said voltage control delay line means outputs, as the delay output, a signal obtained by delaying the external clock in accordance with the control voltage and inverting the delayed external clock and said voltage generator outputs the control voltage which minimizes the amount of delay when an initiating signal is asserted, wherein said control voltage generator comprises:

an analog-voltage generator for receiving a signal indicating the result of phase comparison and outputting an analog-voltage;

an analog-to-digital converter for receiving the analog voltage and converting the analog voltage to a digital signal;

a latch circuit, connected to the analog-to-digital converter, for receiving the digital signal and a latch control signal and latching the digital signal in response to the latch control signal; and a digital-to-analog converter, connected to the latch circuit, for receiving data stored in said latch circuit, converting the data to an analog signal for controlling said voltage control delay line means, and outputting the analog signal.

5. A digital circuit apparatus comprising:

voltage control delay line means for delaying an external clock which has been inputted;

phase comparing means for comparing the phase of the external clock with the phase of a delay output of said voltage control delay line means; and a control voltage generator for outputting a control voltage for controlling the amount of delay for said voltage control delay line means in accordance with the result of phase comparison, wherein said voltage control delay line means outputs, as the delay output, a signal obtained by delaying the external clock in accordance with the control voltage and inverting the delayed external clock and said control voltage generator outputs the control voltage which minimizes the amount of delay when an initiating signal is asserted, wherein said control voltage generator comprises:

an analog-voltage generator for receiving a signal indicating the result of phase comparison and outputting an analog voltage;

a sampling circuit for sampling the analog voltage;

a counter, connected to the sampling circuit, for counting the output of said sampling circuit; and a digital-to-analog converter, connected to the counter, for receiving the count output of said counter, converting the count output to an analog voltage for controlling said voltage control delay line means, and outputting the analog voltage, said counter performing a count-up or count-down operation in accordance with the output of said sampling circuit.

6. A digital circuit apparatus, comprising:

voltage control delay line means for delaying an external clock which has been inputted;

wave-number comparing means for comparing the wave number of a delay output of said voltage control delay line means with the wave number of the external clock and outputting a wave-number comparison result signal;

a counter, connected to the wave-number comparing means, for performing a count-up or count-down operation in response to the wave-number comparison result signal;

a digital-to-analog converter, connected to the counter, for converting a count output of said counter to an analog voltage and outputting a control voltage for controlling said voltage delay line means;

a lock detector, connected to the wave number comparing means, and to the selector means for detecting the matching in wave number of the wave-number comparison result signal and the external clock; and selecting means for selecting between the external clock and the delay output in accordance with a locked state signal outputted from said lock detector;

wherein said voltage control delay line means outputs a delay output which was obtained by delaying and inverting a signal selected by said selecting means in accordance with the control voltage supplied from said digital-to-analog converter, said lock detector outputs the locked state signal when the count value of said counter falls within a predetermined range, and said selecting means selects the external clock after the locked state signal was asserted.

* * * * *